US012676596B2

(12) United States Patent
Okamoto et al.

(10) Patent No.: US 12,676,596 B2
(45) Date of Patent: Jul. 7, 2026

(54) SURFACE ACOUSTIC WAVE DEVICE HAVING MULTILAYER PIEZOELECTRIC SUBSTRATE AND A DIELECTRIC LAYER WITH DIFFERENT THICKNESSES

(71) Applicant: SKYWORKS SOLUTIONS, INC., Irvine, CA (US)

(72) Inventors: Shoji Okamoto, Hirakata (JP); Rei Goto, Osaka (JP); Hironori Fukuhara, Ibaraki (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 797 days.

(21) Appl. No.: 18/177,257

(22) Filed: Mar. 2, 2023

(65) Prior Publication Data
US 2023/0291385 A1 Sep. 14, 2023

Related U.S. Application Data

(60) Provisional application No. 63/318,633, filed on Mar. 10, 2022.

(51) Int. Cl.
*H03H 9/25* (2006.01)
*H03H 9/145* (2006.01)

(52) U.S. Cl.
CPC .......... *H03H 9/25* (2013.01); *H03H 9/14541* (2013.01)

(58) Field of Classification Search
CPC .. H03H 9/25; H03H 9/14541; H03H 9/02535; H03H 9/02574
USPC ...... 310/313 R, 313 A, 313 B, 313 C, 313 D
See application file for complete search history.

(56) References Cited

U.S. PATENT DOCUMENTS 7,345,409 B2 * 3/2008 Leidl .................. H03H 9/02929
310/334
2012/0056507 A1 * 3/2012 Eggs .................... H10N 30/076
427/124

* cited by examiner

*Primary Examiner* — Derek J Rosenau
(74) *Attorney, Agent, or Firm* — Lando & Anastasi, LLP

(57) ABSTRACT

An acoustic wave device comprises a substrate including a piezoelectric material, interdigital transducer (IDT) electrodes including interdigitated electrode fingers disposed on a surface of the substrate, and a passivation layer formed on tops of the IDT electrodes and on the piezoelectric material in gaps between adjacent IDT electrodes, the passivation film being thicker on the tops of the IDT electrodes than on the piezoelectric material in the gaps between adjacent IDT electrodes to improve an electromechanical coupling factor of the acoustic wave device.

20 Claims, 15 Drawing Sheets $hSiN_{IDT} > hSiN_{GAP}$

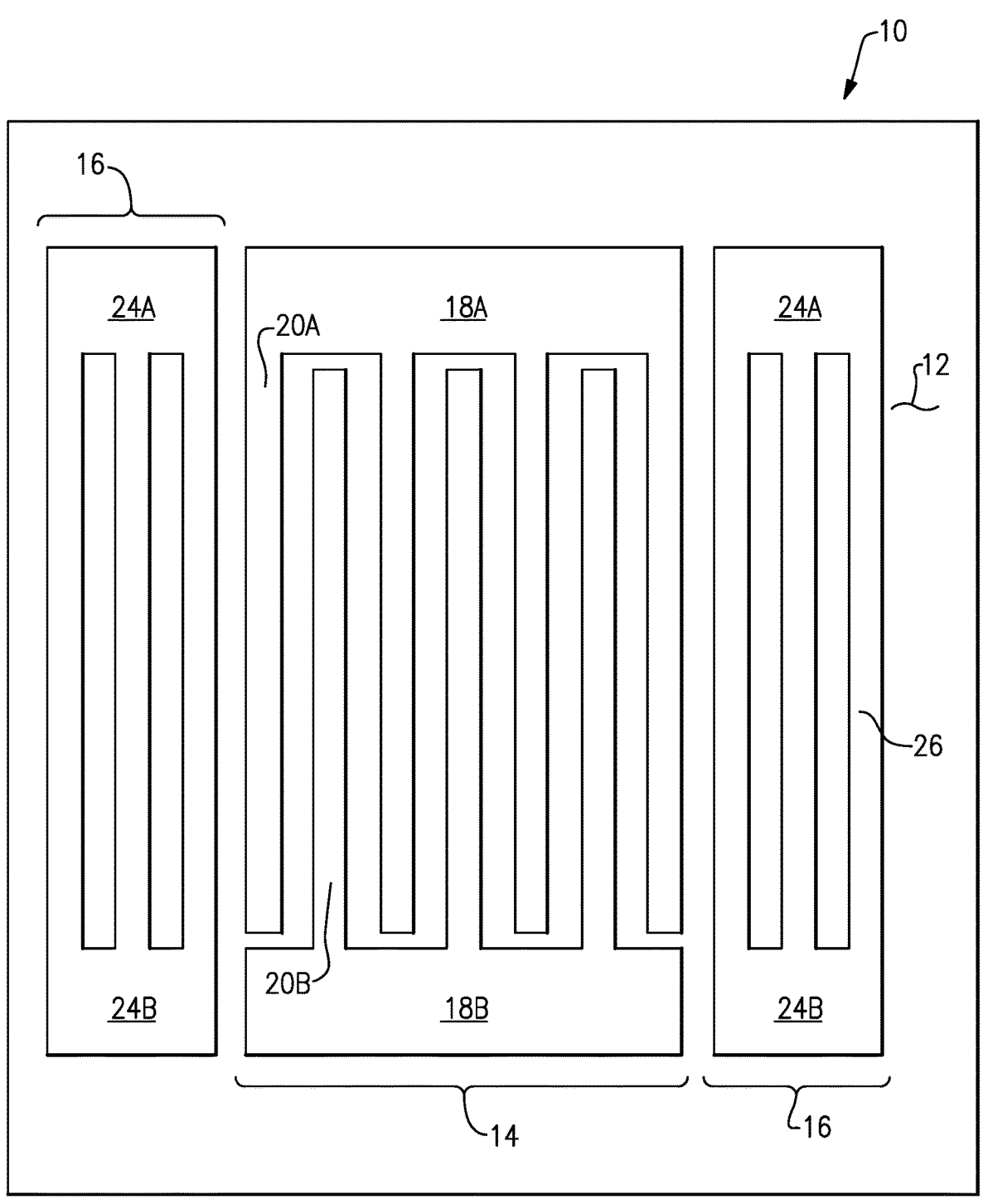
<u>FIG.1A</u>

$$hSiN_{IDT} = hSiN_{GAP}$$

$$hSiN_{IDT} > hSiN_{GAP}$$

$$hSiN_{IDT} > hSiN_{GAP}$$

$$hSiN_{IDT} > hSiN_{GAP}$$

$$hSiN_{IDT} > hSiN_{GAP}$$

$$hSiN_{IDT} > hSiN_{GAP}$$

SURFACE ACOUSTIC WAVE DEVICE HAVING MULTILAYER PIEZOELECTRIC SUBSTRATE AND A DIELECTRIC LAYER WITH DIFFERENT THICKNESSES

CROSS-REFERENCE TO RELATED APPLICATIONS

This application claims priority under 35 U.S.C. § 119(e) to U.S. Provisional Patent Application Ser. No. 63/318,633, titled "SURFACE ACOUSTIC WAVE DEVICE HAVING MULTILAYER PIEZOELECTRIC SUBSTRATE AND A DIELECTRIC LAYER WITH DIFFERENT THICKNESSES," filed Mar. 10, 2022, the entire content of which is incorporated herein by reference for all purposes.

BACKGROUND

Technical Field

Embodiments of this disclosure relate to acoustic wave devices with improved electromechanical coupling coefficients to facilitate high bandwidth operations.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front-end of a mobile phone can include acoustic wave filters. Two acoustic wave filters can be arranged as a duplexer.

SUMMARY

In accordance with one aspect, there is provided an acoustic wave device. The acoustic wave device comprises a substrate including a piezoelectric material, interdigital transducer (IDT) electrodes including interdigitated electrode fingers disposed on a surface of the substrate, and a passivation layer formed on tops of the IDT electrodes and on the piezoelectric material in gaps between adjacent IDT electrodes, the passivation film being thicker on the tops of the IDT electrodes than on the piezoelectric material in the gaps between adjacent IDT electrodes to improve an electromechanical coupling factor of the acoustic wave device.

In some embodiments, the passivation layer is further disposed on sides of the IDT electrodes.

In some embodiments, the passivation layer on the sides of the IDT electrodes is thinner than the passivation layer on the tops of the IDT electrodes.

In some embodiments, the passivation layer on the sides of the IDT electrodes has a same thickness as the passivation layer on the tops of the IDT electrodes.

In some embodiments, the substrate is a multilayer piezoelectric substrate.

In some embodiments, the passivation layer comprises silicon nitride.

In some embodiments, the acoustic wave device further comprises a dielectric material layer disposed on the passivation layer and formed of a different material than the passivation layer.

In some embodiments, the layer of passivation material on the tops of the IDT electrodes is thicker than the dielectric material layer.

In some embodiments, the dielectric material layer comprises an oxide.

In some embodiments, the dielectric material layer comprises silicon oxynitride.

In some embodiments, the IDT electrodes include a first metal layer disposed on a second metal layer, the first metal layer being less dense and more conductive than the second metal layer.

In some embodiments, the acoustic wave device further comprises an intermediate metal layer disposed between the first metal layer and the second metal layer, the intermediate metal layer being formed of a different metal than either of the first metal layer or the second metal layer.

In some embodiments, the intermediate metal layer comprises titanium.

In some embodiments, the acoustic wave device further comprises an intermediate metal layer disposed between the second metal layer and the piezoelectric material.

In some embodiments, the acoustic wave device further comprises an intermediate metal layer disposed between the first metal layer and the passivation layer.

In some embodiments, the acoustic wave device further comprises an intermediate metal layer disposed within the first metal layer, a first portion of the first metal layer being disposed above the intermediate metal layer and a second portion of the first metal layer being disposed below the intermediate metal layer.

In some embodiments, the intermediate metal layer comprises titanium.

In some embodiments, the acoustic wave device is included in a radio frequency filter.

In some embodiments, the radio frequency filter is included in an electronics module. In some embodiments, the electronics module is included in an electronic device.

BRIEF DESCRIPTION OF THE DRAWINGS

Embodiments of this disclosure will now be described, by way of non-limiting example, with reference to the accompanying drawings.

FIG. 1A is a simplified plan view of an example of a surface acoustic wave resonator;

DETAILED DESCRIPTION OF CERTAIN EMBODIMENTS

Figure 1B:
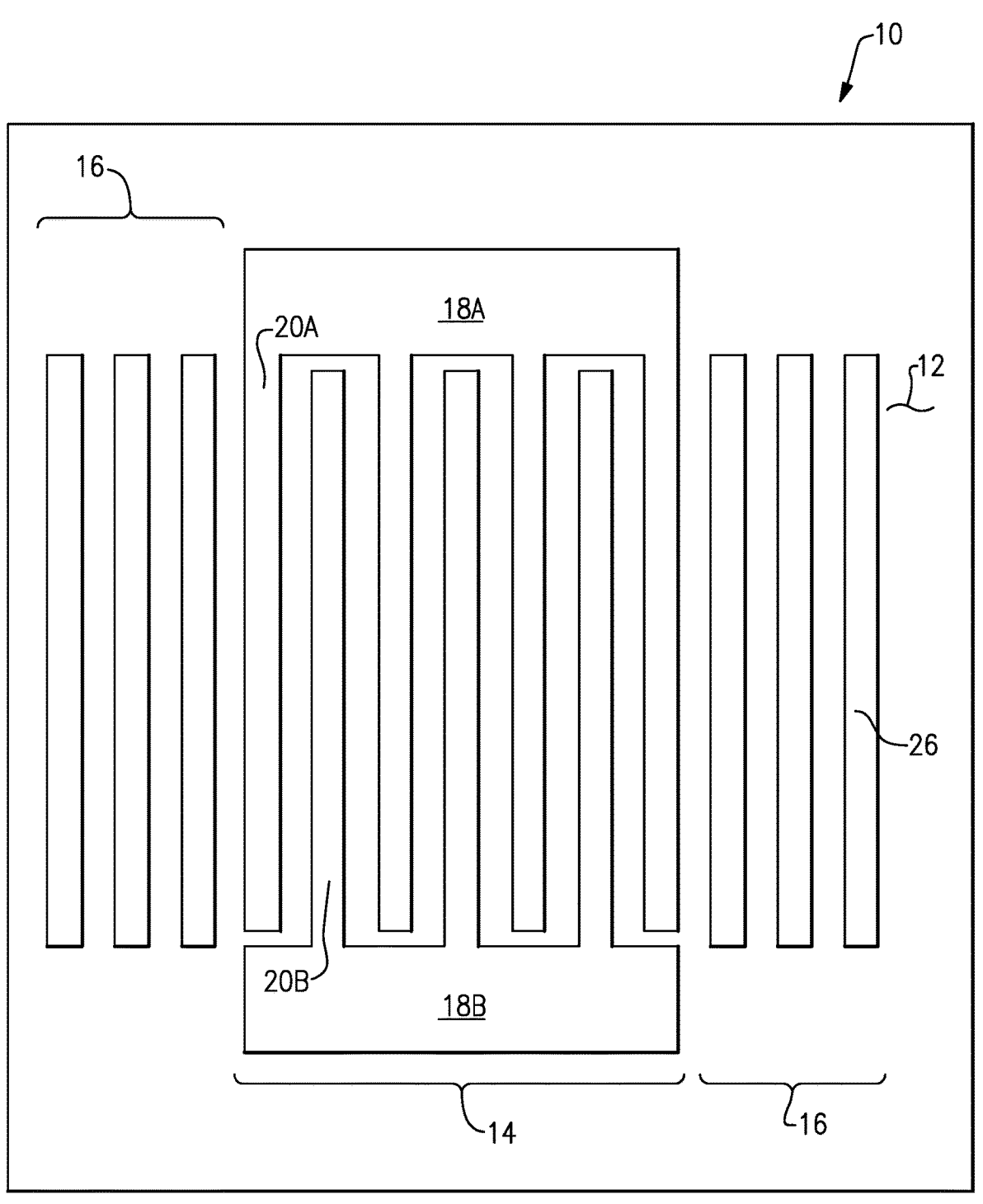
FIG. 1B is a simplified plan view of another example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, balun, etc.

Acoustic wave resonator 10 is formed on substrate 12 including a piezoelectric material layer, for example, a lithium tantalate ($LiTaO_3$) or lithium niobate ($LiNbO_3$) material layer. In some embodiment, as described with reference to FIG. 2 below, the substrate 12 may be a multilayer piezoelectric substrate (MPS). The acoustic wave resonator 10 includes Interdigital Transducer (IDT) electrodes 14 and reflector electrodes 16. In use, the IDT electrodes 14 excite a main acoustic wave having a wavelength λ, along a surface of the substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The bus bar electrodes 18A, 18B may be referred to herein and labelled in the figures as busbar electrode 18. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B (collectively referred to herein as reflector bus bar electrode 24) and reflector fingers 26 extending between and electrically coupling the first bus bar electrode 24A and the second bus bar electrode 24B.

Figure 1C:
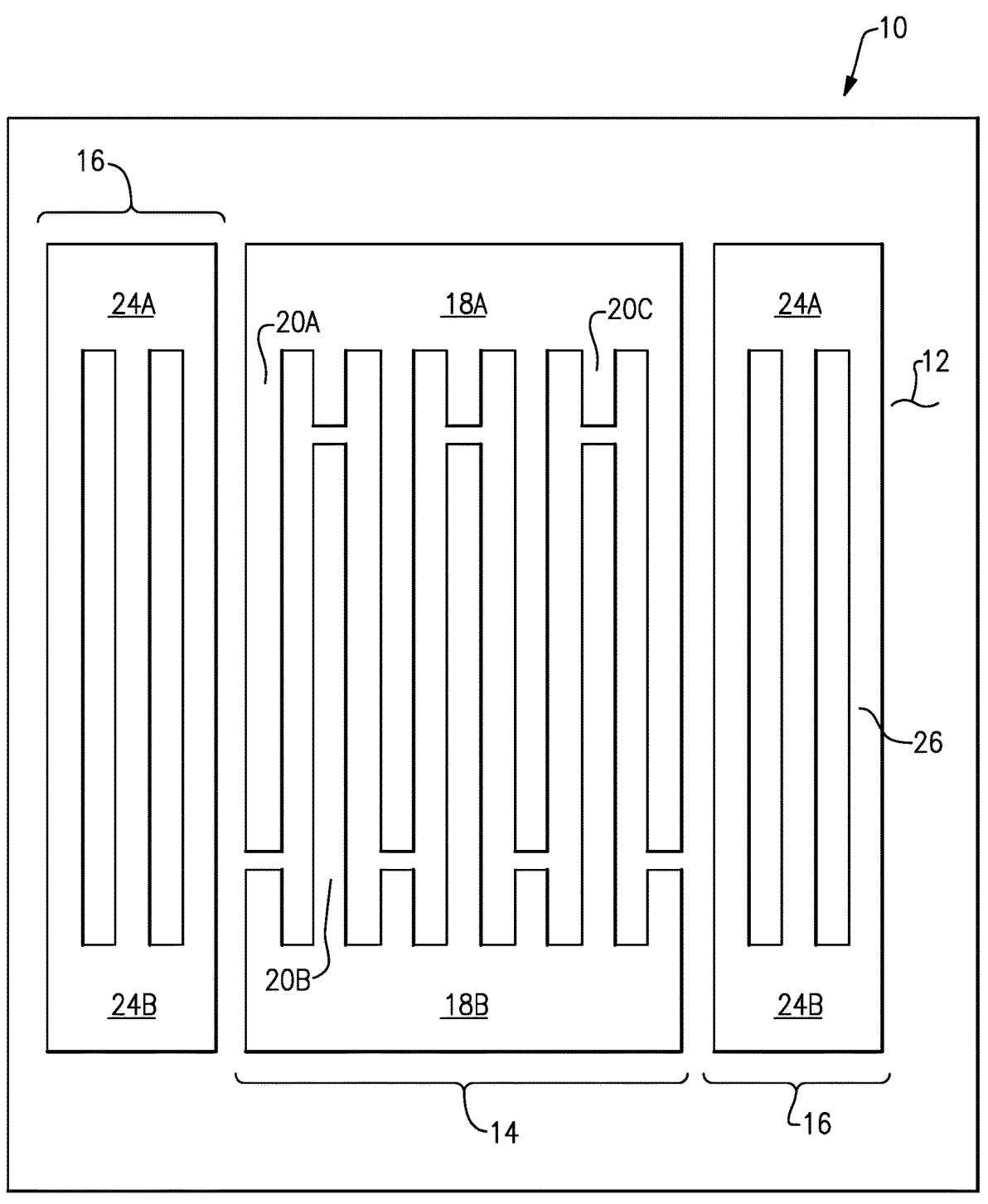
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

It should be appreciated that the acoustic wave resonators 10 illustrated in FIGS. 1A-1C, as well as the other circuit elements illustrated in other figures presented herein, are illustrated in a highly simplified form. The relative dimensions of the different features are not shown to scale. Further, typical acoustic wave resonators would commonly include a far greater number of electrode fingers and reflector fingers than illustrated. Typical acoustic wave resonators or filter elements may also include multiple IDT electrodes sandwiched between the reflector electrodes.

Figure 2:
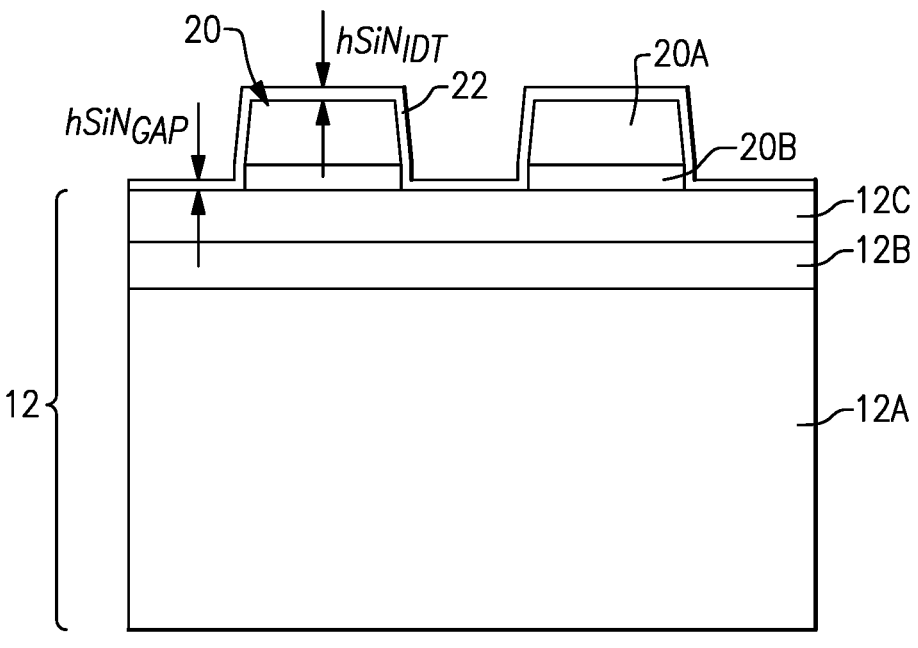
FIG. 2 is a cross-sectional view of a portion of an example of a surface acoustic wave resonator.

FIG. 2 illustrates a cross-section of the substrate 12 and electrodes 20 that may be utilized in surface acoustic wave devices, for example, as illustrated in any of FIGS. 1A-1C above. The electrodes 20 of FIG. 2 may be any of the IDT electrodes 20A, 20B, the dummy electrodes 20C, or the reflector electrodes 26 of a surface acoustic wave device, for example, as illustrated in any of FIGS. 1A-1C above. Aspects and embodiments disclosed herein may be utilized in with any one or more of the IDT electrodes 20A, 20B, the dummy electrodes 20C, or the reflector electrodes 26 of a surface acoustic wave device. The electrodes 20 will, however, be referred to herein as IDT electrodes 20. The substrate 12 is a MPS substrate including a support layer 12A that may be formed of any of Si, quartz, sapphire, or any other suitable material to provide the substrate 12 with a desired amount of mechanical stability. A layer 12B of a dielectric material, for example, $SiO_2$ is disposed on the upper surface of the support layer 12A. A layer 12C of a piezoelectric material for example, a layer of lithium tantalate ($LiTaO_3$) or lithium niobate ($LiNbO_3$) is disposed on the upper surface of the layer 12B of dielectric material. The IDT electrodes 20 are disposed on the upper surface of the layer 12C of piezoelectric material. A dielectric film 22 functioning as a passivation film is disposed over the IDT electrodes 20 and exposed areas of the upper surface of the layer 12C of piezoelectric material. The dielectric film 22 may include or consist of any one or more of silicon nitride ($Si_3N_4$, not necessarily stoichiometric, also abbreviated as "SiN" herein), $SiO_2$, silicon oxynitride ($SiO_xN_y$, or "SiON" herein), AlN, $Al_2O_3$ or any other suitable passivation layer material. The dielectric film 22 may have the same thickness on the tops of the IDT electrodes 20 and on the exposed areas of the upper surface of the layer 12C of piezoelectric material.

As also illustrated in FIG. 2, the IDT electrodes 20 may be layered electrodes including an upper layer 20A of a highly conductive but low-density material, for example, Al, and a lower layer 20B of a less conductive, but more dense material, for example, Mo, W, Pt, Ir, or Ru. The denser lower layer 20B may reduce the acoustic velocity of acoustic waves travelling through the device which may allow the IDT electrode fingers to be spaced more closely for a given operating frequency and allow the SAW device to be reduced in size as compared to a similar device utilizing less dense IDT electrodes. The less dense upper layer 20A may have a higher conductivity than the lower layer 20B to provide the electrode stack with a lower overall resistivity.

In some embodiments, the support layer 12A may have a thickness of between 5λ and 2 mm, the layer 12B of dielectric material may have a thickness of between 0.1λ and 1 k, the layer 12C of piezoelectric material may have a thickness of between 0.1λ and 1λ, the lower electrode layer 20B may have a thickness of between 5 nm and 200 nm, the upper electrode layer may have a thickness of between 100 nm and 600 nm, and the dielectric film 22 may have a thickness ($hSIN_{IDT}$, $hSIN_{GAP}$) between 5 nm and 200 nm. These dimensions are given as examples only and may be selected based on desired device performance characteristics.

With migration of cellular telephones to the fifth-generation (5G) technology standard for broadband cellular networks, it has become desirable to provide acoustic wave filters with wider bandwidths and higher coupling factors to support ultrawide bandwidth filter implementations, for example, B41 full band (2496 MHz-2690 MHz, a 7.5% relative bandwidth (RBW)) than might be easily achieved with filters formed from embodiments of a SAW resonator structure such as illustrated in FIG. 2. A ladder filter as disclosed herein may include SAW resonators with structures that enable the filter to exhibit a RBW wider than 5.5% or wider than 7.5% to facilitate use in ultrawide bandwidth filter implementations.

Figure 3A:
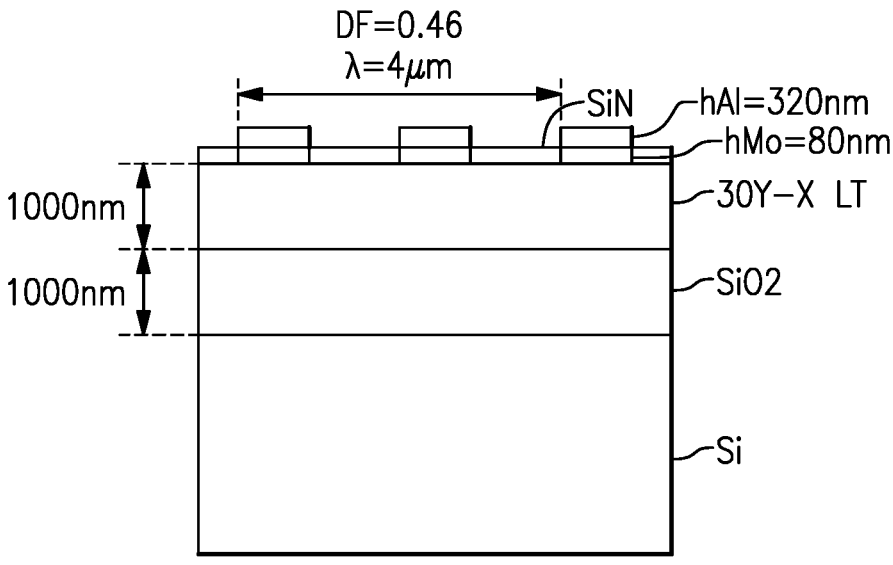
FIG. 3A is a cross-sectional view of a portion of an example of a surface acoustic wave resonator having a first passivation film configuration.
Figure 3B:
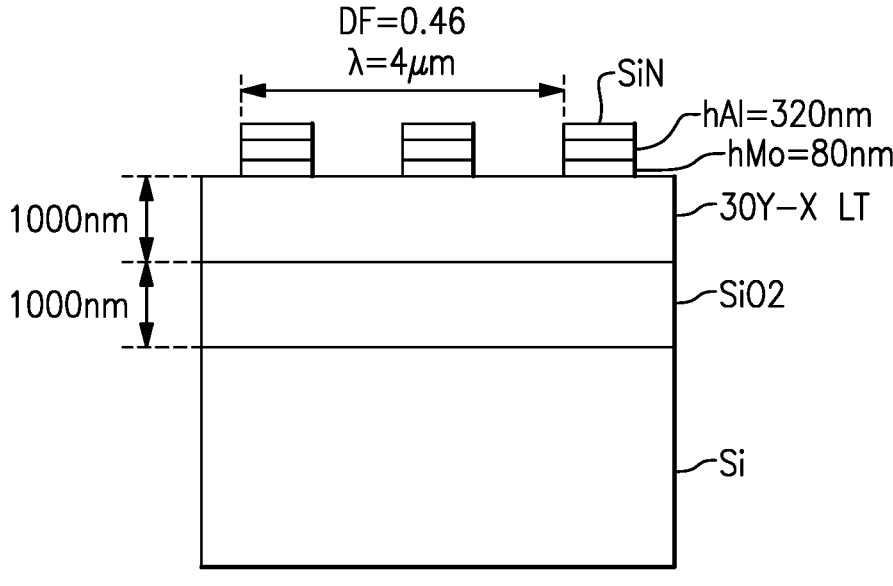
FIG. 3B is a cross-sectional view of a portion of an example of a surface acoustic wave resonator having a second passivation film configuration.
Figure 3C:
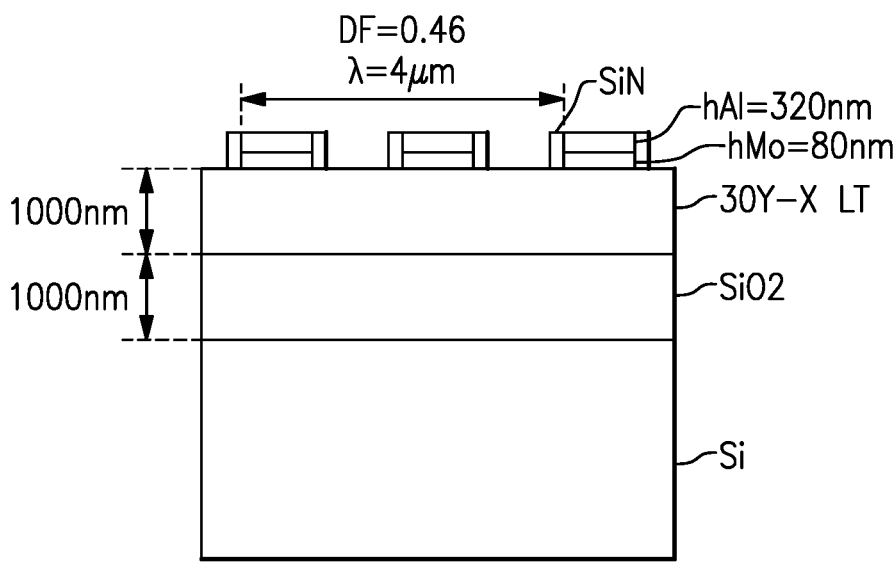
FIG. 3C is a cross-sectional view of a portion of an example of a surface acoustic wave resonator having a third passivation film configuration.
Figure 3D:
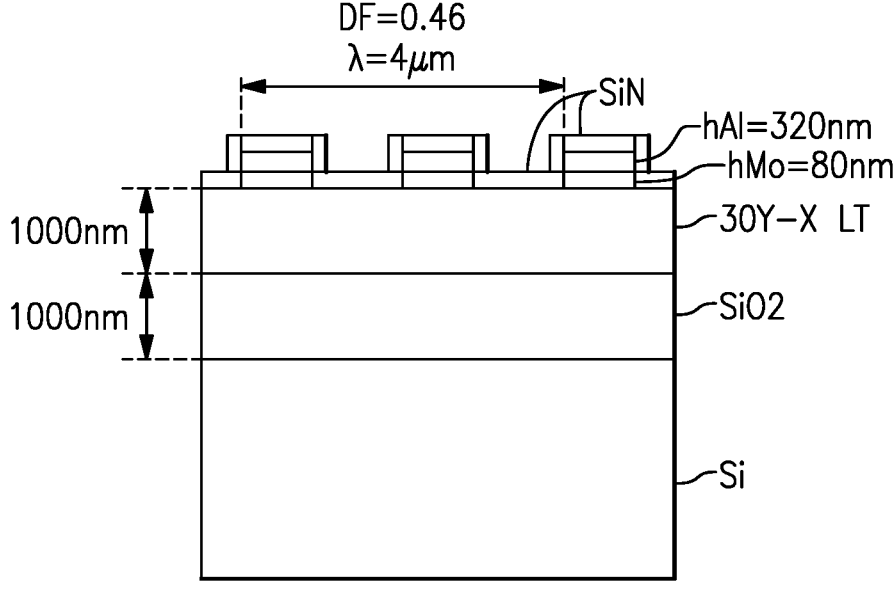
FIG. 3D is a cross-sectional view of a portion of an example of a surface acoustic wave resonator having a fourth passivation film configuration.

Simulations were performed to determine the effect of the configuration and thickness of the dielectric film 22 on acoustic wave velocity through the layer 12C of piezoelectric material and electromechanical coupling coefficient (K2) of an example of a SAW resonator with SiN being used for the dielectric film 22. The different configurations tested included a configuration with the SiN film 22 disposed on the layer 12C of piezoelectric material in the gaps between adjacent IDT electrodes 20 but not on the IDT electrodes 20 themselves ("SiN on GAP" configuration, FIG. 3A), a configuration with the SiN film 22 on top of the IDT electrodes 20 but not on the layer 12C of piezoelectric material in the gaps between adjacent IDT electrodes 20 ("SiN on IDT" configuration, FIG. 3B), a configuration with the SiN film 22 disposed on the sides of the IDT electrodes 20, but not on top of the IDT electrodes 20 or on the layer 12C of piezoelectric material in the gaps between adjacent IDT electrodes 20 ("SiN on Side wall" configuration, FIG. 3C), and a configuration similar to the baseline configuration of FIG. 2 where the SiN was disposed on tops and sides of the IDT electrodes 20 as well as on the layer 12C of piezoelectric material in the gaps between adjacent IDT electrodes 20 ("SiN on top, side, and gap" configuration, FIG. 3D). The IDT electrodes 20 were simulated as including a 320 nm thick layer of Al disposed on an 80 nm thick layer of Mo in each configuration and with a duty factor (DF) of 0.46 and a period of 4 μm. The layer 12B of dielectric material was simulated as SiO₂ with a thickness of 1000 nm and the layer 12C of piezoelectric material was simulated as lithium tantalate with a thickness of 1000 nm in each configuration. The support layer 12A was simulated as being Si in each configuration.

Figure 4A:
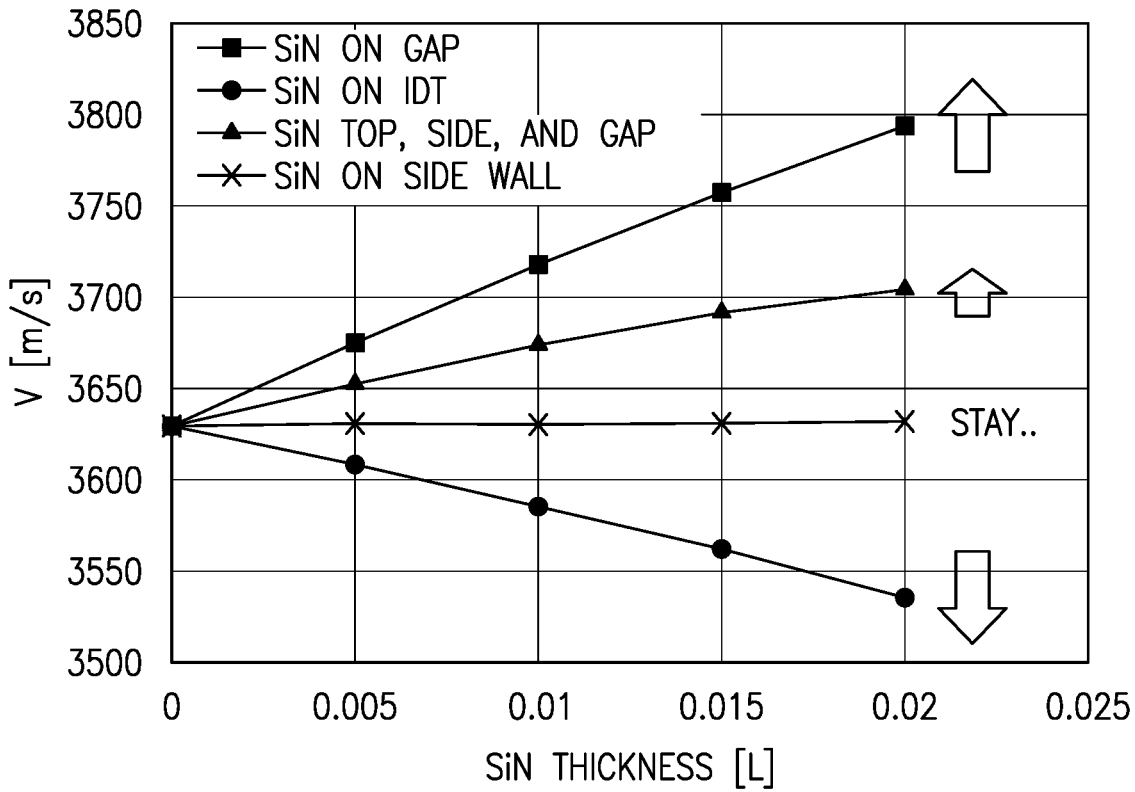
FIG. 4A illustrates results of simulations of acoustic wave velocity as a function of passivation film thickness for surface acoustic wave resonators having the passivation film configurations of FIGS. 3A-3D.
Figure 4B:
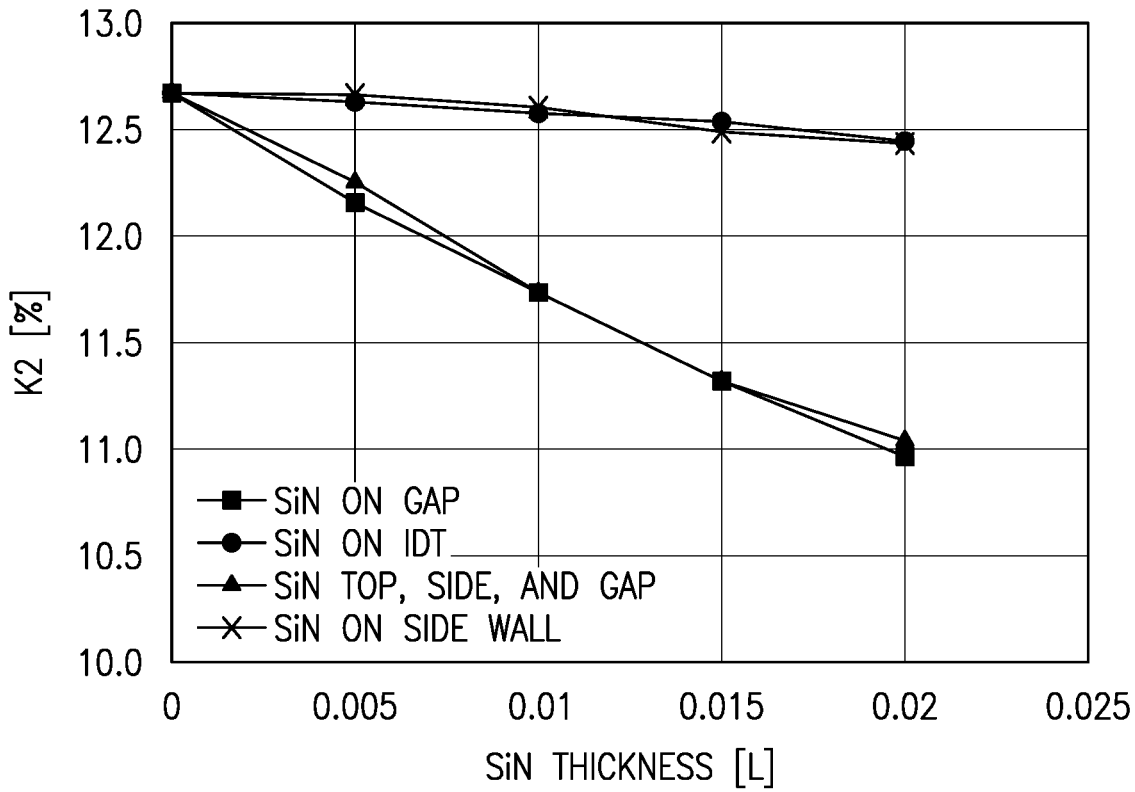
FIG. 4B illustrates results of simulations of electromechanical coupling coefficient as a function of passivation film thickness for surface acoustic wave resonators having the passivation film configurations of FIGS. 3A-3D.

The results of the simulations of acoustic velocity versus SiN layer thickness and for electromechanical coupling coefficient versus SiN layer thickness for each configuration are illustrated in FIGS. 4A and 4B, respectively. As can be seen in FIG. 4A, acoustic velocity increased with an increase in SiN layer thickness for the "SiN on GAP" configuration and increased with an increase in SiN layer thickness to a lesser degree for the "SiN on top, side, and gap" configuration. For the "SiN on Side wall" configuration, the acoustic velocity was substantially unchanged with changes in SiN layer thickness. The acoustic velocity decreased with an increase in SiN layer thickness for the "SiN on IDT" configuration.

As can be seen in FIG. 4B, the electromechanical coupling coefficient decreased with an increase in SiN thickness to a similar degree for both the "SiN on GAP" and "SiN on top, side, and gap" configurations. The electromechanical coupling coefficient also decreased slightly with an increase in SiN thickness to a similar degree for both the "SiN on Side wall" and "SiN on IDT" configurations, but to a much lesser degree than for the "SiN on GAP" and "SiN on top, side, and gap" configurations.

The results of these simulations show that the degradation in electromechanical coupling coefficient was much greater with an increase in SiN layer thickness when the SiN layer was present on the layer 12C of piezoelectric material in the gaps between adjacent IDT electrodes 20. Accordingly, to maintain a high electromechanical coupling coefficient in a SAW resonator as disclosed herein it may be beneficial to minimize the thickness of the dielectric film 22 on the layer 12C of piezoelectric material in the gaps between adjacent IDT electrodes 20. A small thickness, for example, 5 nm or more of dielectric film 22 should, however, be present on the layer 12C of piezoelectric material in the gaps between adjacent IDT electrodes 20 to properly passivate the upper side of the layer 12C of piezoelectric material. Similarly, a thin layer, for example, with a thickness of 5 nm or more of the dielectric film 22 should be present on the sides of the IDT electrodes to keep the IDT electrodes from oxidizing or corroding. One example of this structure is shown in FIG. 5.

The presence of the dielectric film 22 on the sides of the IDT electrodes is not as bad for the electromechanical coupling coefficient of the SAW resonator as the presence of the dielectric film 22 on the layer 12C of piezoelectric material in the gaps between adjacent IDT electrodes 20. The thickness of the dielectric film 22 on the sides of the IDT electrodes may this be similar to or the same as the thickness of the dielectric film on the tops of the IDT electrodes 20.

Figure 5:
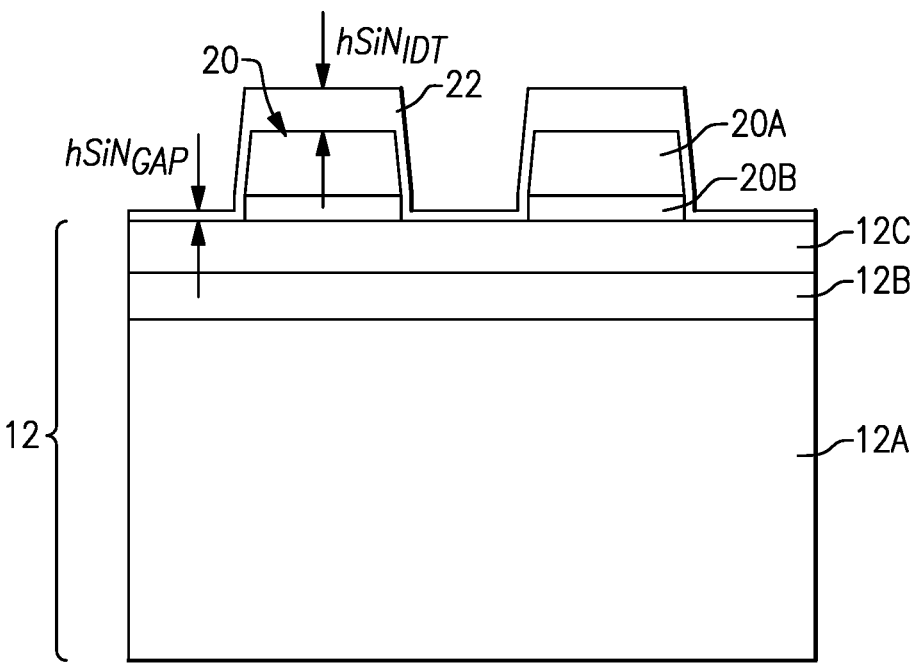
FIG. 5 is a cross-sectional view of a portion of another example of a surface acoustic wave resonator.
Figure 6:
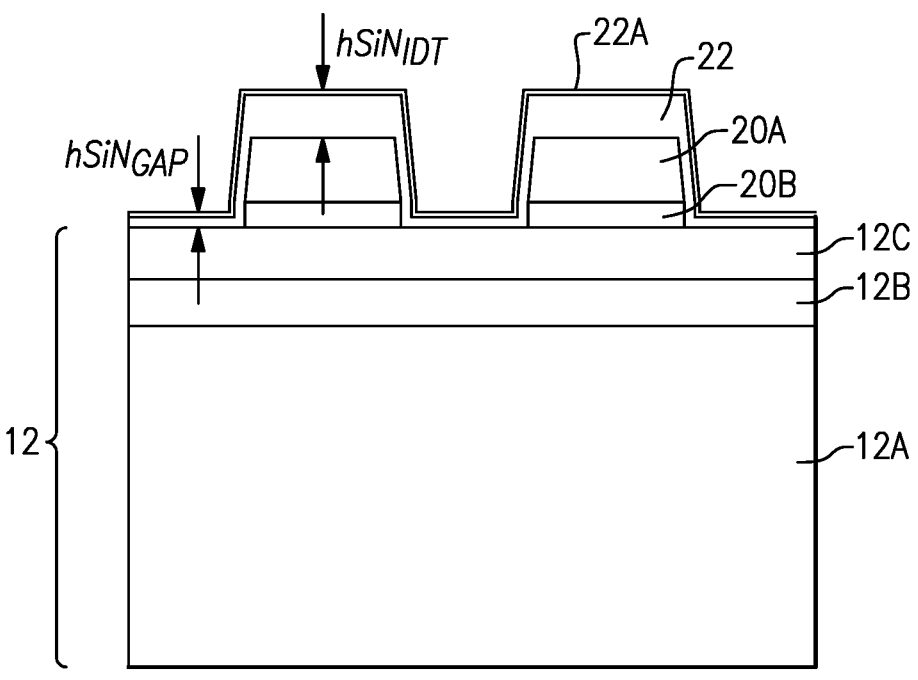
FIG. 6 is a cross-sectional view of a portion of another example of a surface acoustic wave resonator.

Various alterations may be made to the SAW resonator structure of FIG. 5 that may provide improved performance. In one example, instead of the dielectric film 22 being one material, for example, SiN, an additional dielectric film 22A, for example, an oxide such as SiON may be disposed on the dielectric film 22. The additional dielectric film 22A may have thickness of, for example, between 5 nm and 30 nm. The additional dielectric film 22A may improve protection of the IDT electrode 20 and avoid shifts in operating frequency of the SAW resonator over time by preventing oxidation of the dielectric film 22. An example of this structure is illustrated in FIG. 6.

Figure 7:
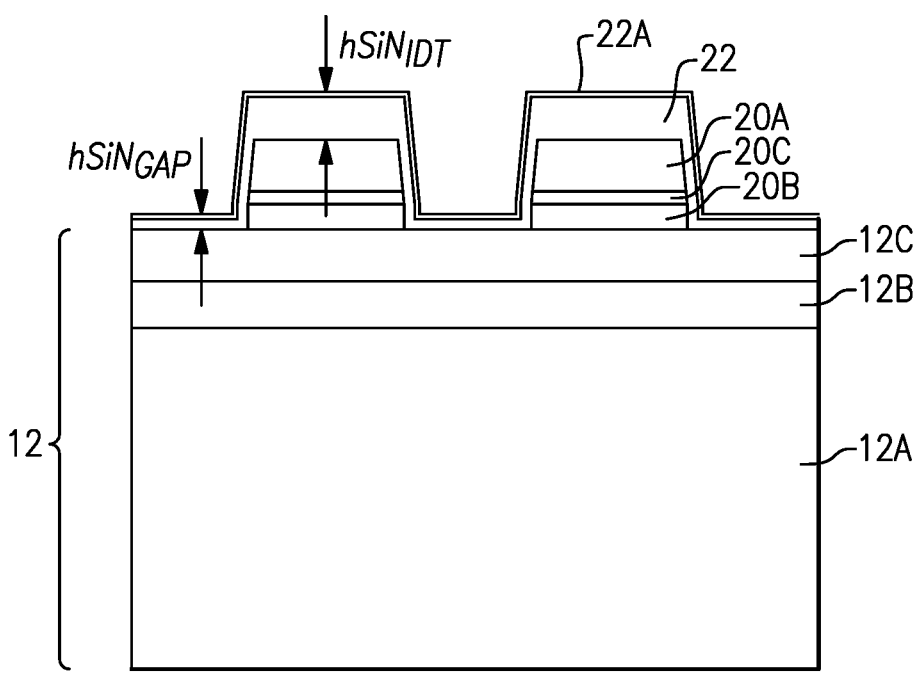
FIG. 7 is a cross-sectional view of a portion of another example of a surface acoustic wave resonator.

In another example, a thin (e.g., 5 nm-100 nm) intermediate metal layer 20C, for example, a layer of Ti may be disposed between the IDT electrode upper and lower layers 20A, 20B. The intermediate metal layer 20C may improve the crystalline quality of the material of the upper IDT layer 20A by better matching of the lattice constant of the material of the upper IDT layer 20A and may function as a stress buffer layer. An example of this structure is illustrated in FIG. 7.

Figure 8:
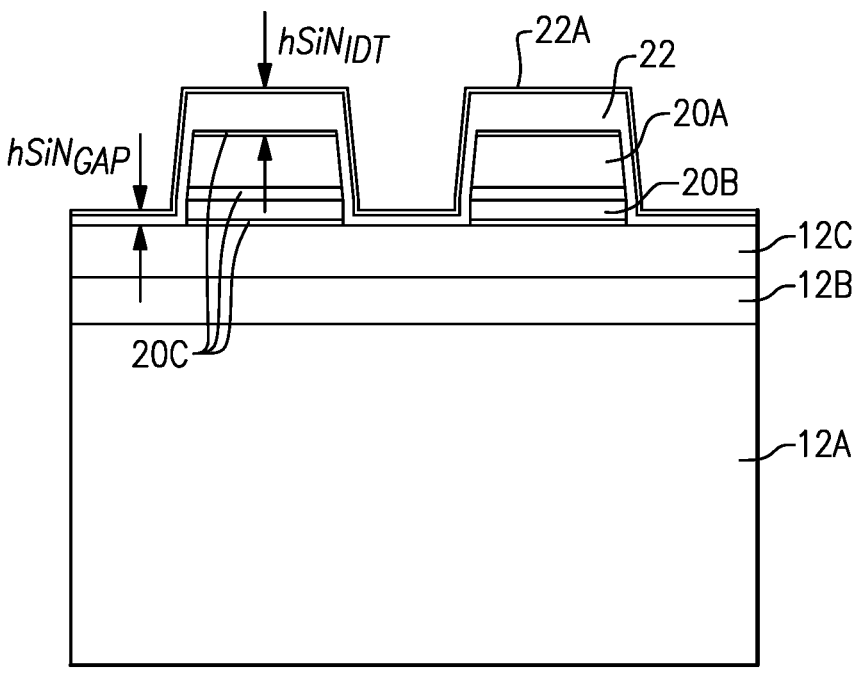
FIG. 8 is a cross-sectional view of a portion of another example of a surface acoustic wave resonator.
Figure 9:
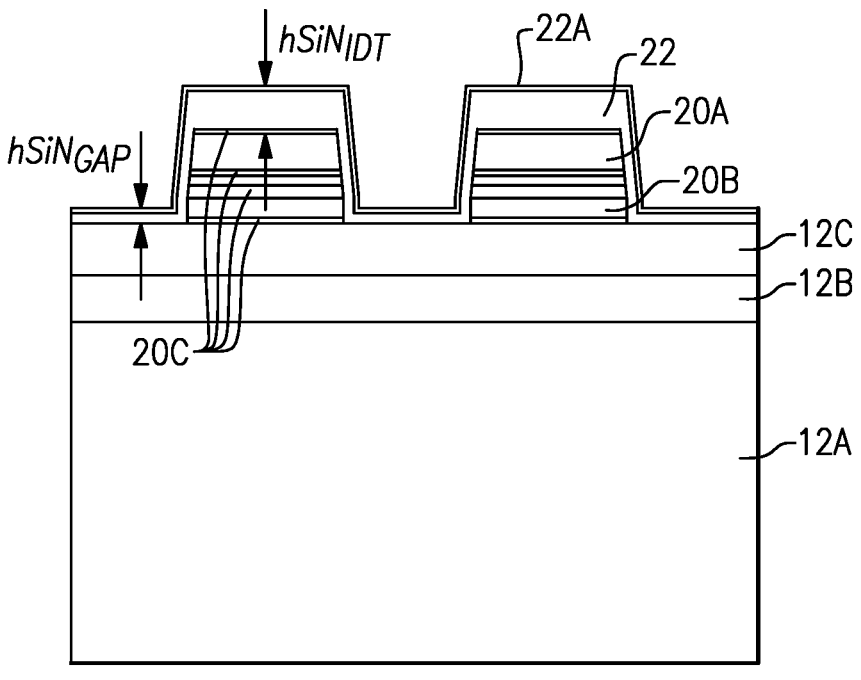
FIG. 9 is a cross-sectional view of a portion of another example of a surface acoustic wave resonator.

As illustrated in FIG. 8, the intermediate metal layer 20C may also or alternatively be provided between the lower IDT electrode layer 20B and the layer of piezoelectric material 1C and/or between the upper IDT electrode layer 20A and the dielectric film 22 to improve adhesion between the lower IDT electrode layer 20B and the layer of piezoelectric material 12C and/or reduce the tendency for hillocks, extrusions, or breaks to form in the upper IDT electrode layer 20A due to electromigration. An additional intermediate metal layer 12C disposed within the upper IDT electrode layer 20A such that a portion of the upper IDT electrode layer 20A is disposed above the additional intermediate metal layer 20C and a second portion of the upper IDT electrode layer 20A is disposed below the additional intermediate metal layer 20C as illustrated in FIG. 9 may further protect the upper IDT electrode layer 20A from deformation or breaks due to electromigration.

Figure 10:
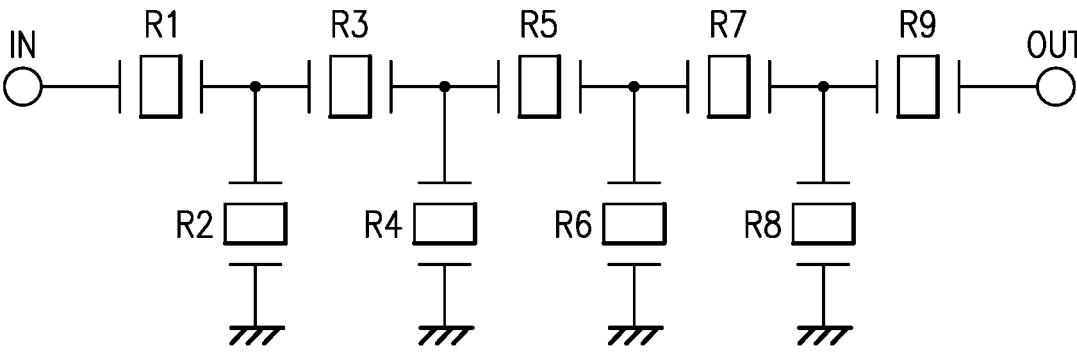
FIG. 10 is a schematic diagram of a radio frequency ladder filter.

In some embodiments, multiple SAW resonators as disclosed herein may be combined into a filter, for example, an RF ladder filter schematically illustrated in FIG. 10 and including a plurality of series resonators R1, R3, R5, R7, and R9, and a plurality of parallel resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include SAW devices or resonators, for example, duplexers, baluns, etc., may also be formed including examples of SAW resonators as disclosed herein.

Figure 11:
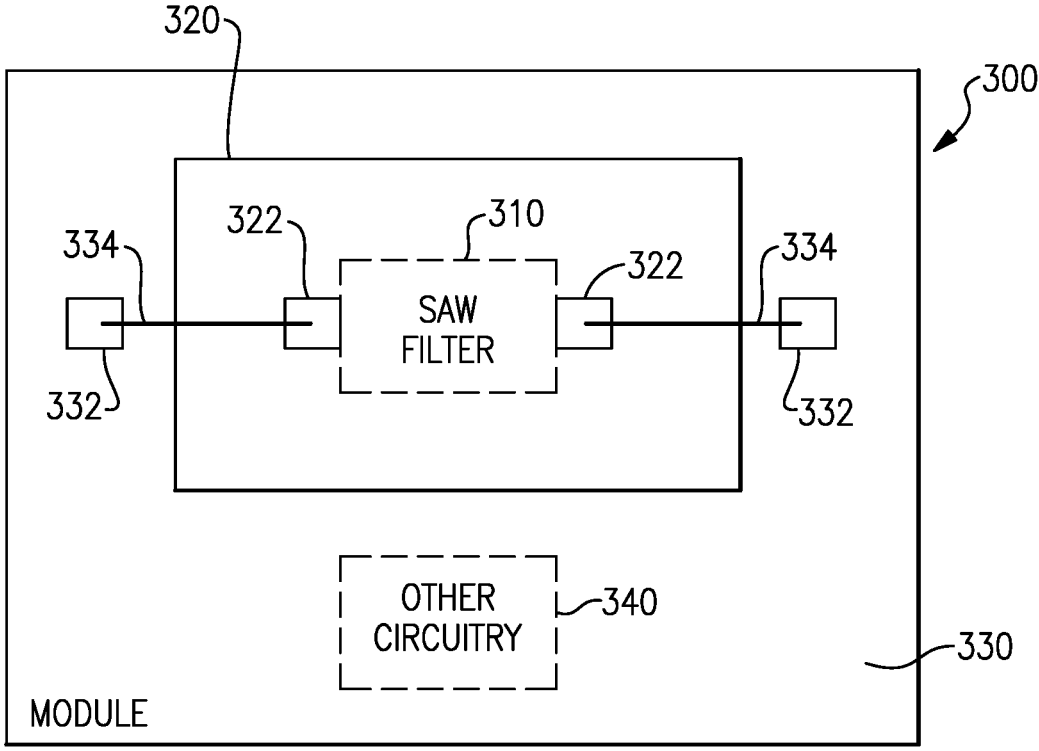
FIG. 11 is a block diagram of one example of a filter module that can include one or more surface acoustic wave resonators according to aspects of the present disclosure.
Figure 12:
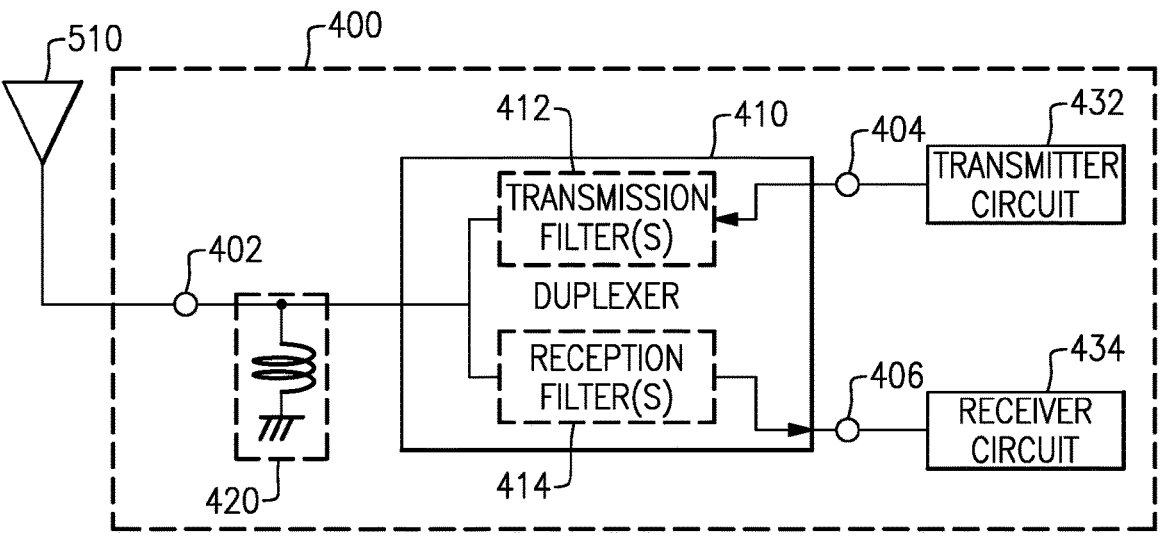
FIG. 12 is a block diagram of one example of a front-end module that can include one or more filter modules according to aspects of the present disclosure.
Figure 13:
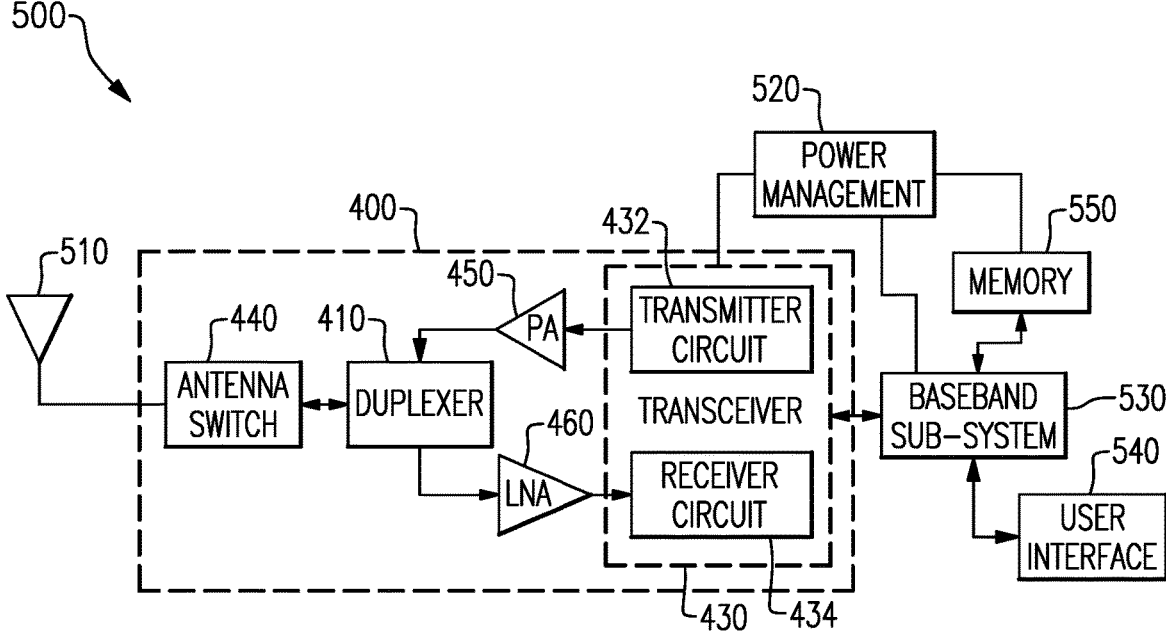
FIG. 13 is a block diagram of one example of a wireless device including the front-end module of FIG. 12.

The acoustic wave resonators discussed herein can be implemented in a variety of packaged modules. Some example packaged modules will now be discussed in which any suitable principles and advantages of the packaged acoustic wave resonators discussed herein can be implemented. FIGS. 11, 12, and 13 are schematic block diagrams of illustrative packaged modules and devices according to certain embodiments.

As discussed above, embodiments of the surface acoustic wave elements can be configured as or used in filters, for example. In turn, a surface acoustic wave (SAW) filter using one or more surface acoustic wave elements may be incorporated into and packaged as a module that may ultimately be used in an electronic device, such as a wireless communications device, for example. FIG. 11 is a block diagram illustrating one example of a module 300 including a SAW filter 310. The SAW filter 310 may be implemented on one or more die(s) 320 including one or more connection pads 322. For example, the SAW filter 310 may include a connection pad 322 that corresponds to an input contact for the SAW filter and another connection pad 322 that corresponds to an output contact for the SAW filter. The packaged module 300 includes a packaging substrate 330 that is configured to receive a plurality of components, including the die 320. A plurality of connection pads 332 can be disposed on the packaging substrate 330, and the various connection pads 322 of the SAW filter die 320 can be connected to the connection pads 332 on the packaging substrate 330 via electrical connectors 334, which can be solder bumps or wirebonds, for example, to allow for passing of various signals to and from the SAW filter 310. The module 300 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 300 can also include one or more packaging structures to, for example, provide protection and facilitate easier handling of the module 300. Such a packaging structure can include an overmold formed over the packaging substrate 330 and dimensioned to substantially encapsulate the various circuits and components thereon.

Various examples and embodiments of the SAW filter 310 can be used in a wide variety of electronic devices. For example, the SAW filter 310 can be used in an antenna duplexer, which itself can be incorporated into a variety of electronic devices, such as RF front-end modules and communication devices.

Referring to FIG. 12, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filter 310 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 12, however in other embodiments these components may be integrated into a common transceiver circuit or module. As will be appreciated by those skilled in the art, the front-end module 400 may include other components that are not illustrated in FIG. 12 including, but not limited to, switches, electromagnetic couplers, amplifiers, processors, and the like.

FIG. 13 is a block diagram of one example of a wireless device 500 including the antenna duplexer 410 shown in FIG. 12. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 12. The front-end module 400 includes the duplexer 410, as discussed above. In the example shown in FIG. 13 the front-end module 400 further includes an antenna switch 440, which can be configured to switch between different frequency bands or modes, such as transmit and receive modes, for example. In the example illustrated in FIG. 13, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 12.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 13, the front-end module 400 may further include a low noise amplifier module 460, which amplifies received signals from the antenna 510 and provides the amplified signals to the receiver circuit 434 of the transceiver 430.

The wireless device 500 of FIG. 13 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a substrate including a piezoelectric material;
interdigital transducer (IDT) electrodes including interdigitated electrode fingers disposed on a surface of the substrate; and
a passivation layer formed on tops of the IDT electrodes and on the piezoelectric material in gaps between adjacent IDT electrodes, the passivation layer being thicker on the tops of the IDT electrodes than on the piezoelectric material in the gaps between adjacent IDT electrodes to improve an electromechanical coupling factor of the acoustic wave device.

2. The acoustic wave device of claim 1 wherein the passivation layer is further disposed on sides of the IDT electrodes.

3. The acoustic wave device of claim 2 wherein the passivation layer on the sides of the IDT electrodes is thinner than the passivation layer on the tops of the IDT electrodes.

4. The acoustic wave device of claim 2 wherein the passivation layer on the sides of the IDT electrodes has a same thickness as the passivation layer on the tops of the IDT electrodes.

5. The acoustic wave device of claim 1 wherein the substrate is a multilayer piezoelectric substrate.

6. The acoustic wave device of claim 1 wherein the passivation layer comprises silicon nitride.

7. The acoustic wave device of claim 6 further comprising a dielectric material layer disposed on the passivation layer and formed of a different material than the passivation layer.

8. The acoustic wave device of claim 7 wherein the layer of passivation material on the tops of the IDT electrodes is thicker than the dielectric material layer.

9. The acoustic wave device of claim 7 wherein the dielectric material layer comprises an oxide.

10. The acoustic wave device of claim 9 wherein the dielectric material layer comprises silicon oxynitride.

11. The acoustic wave device of claim 1 wherein the IDT electrodes include a first metal layer disposed on a second metal layer, the first metal layer being less dense and more conductive than the second metal layer.

12. The acoustic wave device of claim 11 further comprising an intermediate metal layer disposed between the first metal layer and the second metal layer, the intermediate metal layer being formed of a different metal than either of the first metal layer or the second metal layer.

13. The acoustic wave device of claim 12 wherein the intermediate metal layer comprises titanium.

14. The acoustic wave device of claim 11 further comprising an intermediate metal layer disposed between the second metal layer and the piezoelectric material.

15. The acoustic wave device of claim 11 further comprising an intermediate metal layer disposed between the first metal layer and the passivation layer.

16. The acoustic wave device of claim 11 further comprising an intermediate metal layer disposed within the first metal layer, a first portion of the first metal layer being disposed above the intermediate metal layer and a second portion of the first metal layer being disposed below the intermediate metal layer.

17. The acoustic wave device of claim 14 wherein the intermediate metal layer comprises titanium.

18. A radio frequency filter comprising the acoustic wave device of claim 1.

19. An electronics module comprising the radio frequency filter of claim 18.

20. An electronic device including the electronics module of claim 19.

* * * * *